Figure 1:
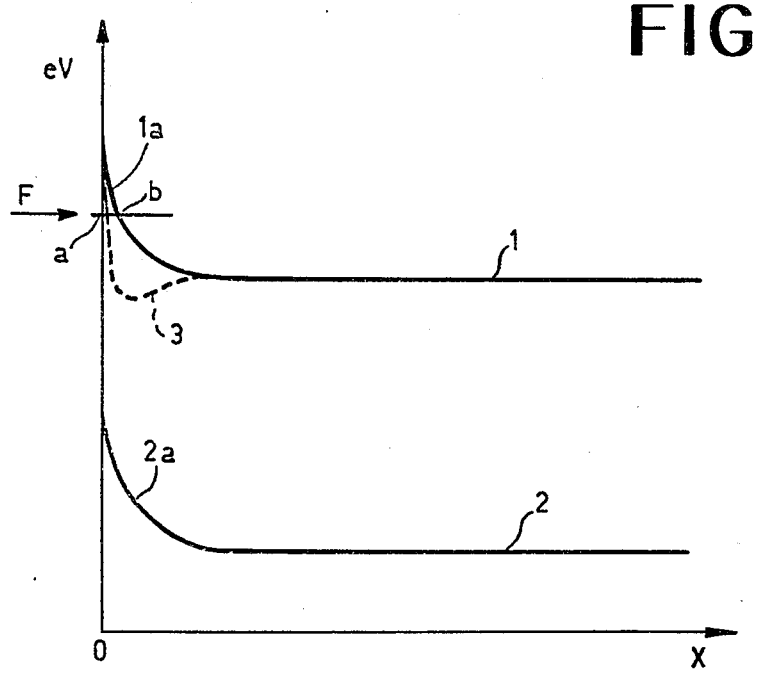

United States Patent [19]
Diguet et al.

[11] B 3,987,480

[45] Oct. 19, 1976

[54] III-V SEMICONDUCTOR DEVICE WITH OHMIC CONTACT TO HIGH RESISTIVITY REGION

[75] Inventors: Daniel Diguet, Caen; Jean-Pierre Rioult, Epron, both of France

[73] Assignee: U.S. Philips Corporation, New York, N.Y.

[22] Filed: May 17, 1974

[21] Appl. No.: 470,798

[44] Published under the second Trial Voluntary Protest Program on January 20, 1976 as document No. B 470,798.

[30] Foreign Application Priority Data

May 18, 1973  France .............................. 73.18120

[52] U.S. Cl. ................................. 357/65; 357/67; 357/68
[51] Int. Cl.² ................... H01L 23/48; H01L 23/40
[58] Field of Search .................... 357/65, 66, 67, 68

[56] References Cited

UNITED STATES PATENTS

| 3,716,407 | 2/1973 | Kahn | 357/67 |
| 3,753,804 | 8/1973 | Tijburg et al. | 357/67 |
| 3,767,482 | 10/1973 | Kock et al. | 357/67 |
| 3,780,427 | 12/1973 | Jenkins et al. | 357/67 |
| 3,794,883 | 2/1974 | Bylander et al. | 357/67 |
| 3,818,377 | 6/1974 | Yamashita et al. | 357/67 |

*Primary Examiner*—Andrew J. James
*Attorney, Agent, or Firm*—Frank R. Trifari; Jack Oisher

[57] ABSTRACT

The invention relates to a semiconductor device having a weakly doped region which comprises an ohmic contact.

According to the invention the ohmic contact comprises two elements of which one causes in the semi-conductor body the same conductivity type as that of the region on which said contact is present.

6 Claims, 2 Drawing Figures

| ONE OF | | ONE OF |
|---|---|---|
| Al | | Zn |
| Ta | | Be |
| Ti | + | Mg |
| Zr | | Cd |
| | | Si |
| | | Ge |
| | | Sn |
| | | S |
| | | Se |
| | | Te |

III-V SEMICONDUCTOR DEVICE WITH OHMIC CONTACT TO HIGH RESISTIVITY REGION

The present invention relates to a body of semiconductor material which consists mainly of at least one element of the column IIIA of the periodic table of elements of which the atomic number is lower than 50 and at least one element of the column VA of the said table of which the atomic number is lower than 52, the body comprising at least one region of a given conductivity type of which the net number of impurities causing the said conductivity type is lower than $10^{17}$ atoms per $cm^3$, the said region comprising at least one ohmic contact.

The present invention also relates to a method of manufacturing such a body.

It is known that the properties at the surface or in the bulk of a body of semiconductor material are affected considerably by all lattice defects which involve the presence of free electrons or holes. In the first case the material is of the $n$ type and in the second case it is of the $p$ type.

These lattice defects are often caused by the presence of impurities which cause either the $n$ type or the $p$ conductivity type to which presence may be added in the case of compounds a weak disturbance of the stoichiometric equilibrium, the element which is present in excess forming an impurity.

It is well known that if in the same material the number of $n$ type causing impurities is equivalent to the number of $p$ type causing impurities, said so-called compensated material re-obtains a large part of the properties of the pure materials and that the characteristic features of a material which is obtained by the introduction of slightly different numbers of impurities are just dependent on the difference between said two numbers of impurities.

The present invention relates to III-V semiconductor bodies of which the net number of impurities is lower than $10^{17}$ atoms per $cm^3$.

It is known that the manufacture of ohmic contacts on regions of semiconductor bodies having a small number of impurities of a single type or with a small net difference of impurites of both types is a problem which is difficult to solve. On a substantially degenerated semiconductor region a layer of certain metals may be deposited, for example, a layer of aluminum, in which the semimetallic character of the material is sufficient to cause the ohmic character of the resulting contact.

On a semiconductor region having a small number (or net number) of impurities on the contrary, the deposition of a pure metal is not sufficient to ensure the ohmic character of the contact, even if said deposit is succeeded by a diffusion heating. This holds good in particular in the case of the so-called III-V semiconductor materials, compounds which contain mainly at least one element of column IIIA of the periodic table of elements and at least one element of column VA of the said table. On said materials appears a surface inversion layer at the above-mentioned doping level of $10^{17}$ atoms per ccm and renders the above-mentioned conventionally used process which uses heavy doping levels entirely useless.

Otherwise, the use of materials of the III-V type having a small doping level is indispensable for the manufacture of a large number of devices, for example, the ready functioning of electroluminescent gallium phosphide diodes (GaP) to obtain an efficient green luminescence necessitates an optimum net number of impurities which is lower than $10^{17}$ atoms per ccm. Likewise, gallium arsenide oscillators (Ga As) operating by the Gunn effect necessitate an optimum number of net impurities of approximately $10^{15}$ atoms per ccm.

In certain cases, contacts of pure gold or of a gold alloy have been used for said devices, but said technology has proved difficult and its results are often poor. Actually, the gold diffuses very rapidly in the III-V compounds and the presence thereof in the vicinity of the junctions vary the operation thereof. In order to maintain the gold at the surface, the temperatures used during the deposition and hardening must be comparatively low so as to avoid rapid diffusion but they must nevertheless be sufficient to cause the adhesion of the gold to the material; as a result of this the temperature ranges are very narrow, difficult and costly to obtain while the number of rejects is high.

Finally, gold tends to form alloys with the III-V compounds which recrystallize upon heating. This phenomenon becomes the more prominent in the case of gold-germanium and gold-tin in which the formed alloy is no doubt more complicated. The recrystallized zones which lose the properties of the basic material often inhibit good photo-etching.

In addition, the number of structures in which gold is useful is considerably reduced, for gold adheres neither to silicon oxide nor to silicon nitride. As a result of this it is not possible to use gold for the application of numerous methods, especially for the socalled planar methods.

It is the object of the present invention to mitigate the said drawbacks.

According to the invention, a body of semiconductor material which consists mainly of at least one element of column IIIA of the peridic table of elements of which the atomic number is lower than 50 and at least one element of column VA of the said table of which the atomic number is lower than 52, the said body comprising at least one region of a given conductivity type of which the net nunber of impurities causing the said conductivity type is lower than $10^{17}$ atoms per ccm, the said region comprising at least one ohmic contact, is characterized in that the said ohmic contact comprises at least two elements of which a first base metal element has been chosen from a first group which consist of aluminum, tantalum, titanium, zirconium and a second element has been chosen from a second group which consists of zinc, beryllium, magnesium, cadmium, silicon, germanium, tin, sulphur, selenium, and tellurium and which causes in a semiconductor the conductivity type of the region which supports the said contact.

Figure 2:
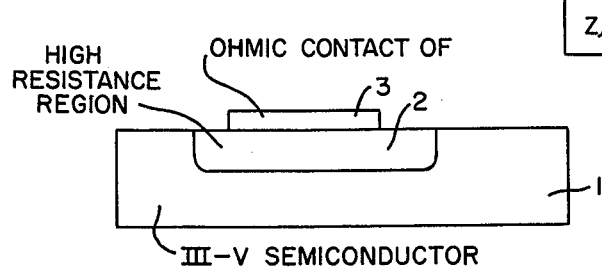

The invention will be described in greater detail also with reference to the accompanying drawing, of which FIG. 1 shows the energy levels of the material of a semiconductor body near the interface and FIG. 2 is a schematic view of a device in accordance with the invention.

Applicants have found that all the metals of the first-mentioned group have a given number of common properties which make them suitable to form the base element of the contact: they form no alloys with the compound of the III-V type. They themselves have no influence on the conductivity type of the material, mainly because they do not diffuse at low temperature.

They adhere to the surface of the material of the III-V type. They furthermore adhere to the materials usually used in planar technology as a protecting layer, for example, silicon oxide and silicon nitride, which makes it possible to use them in said technology and hence to use said technology for materials of the III-V type having a small number of impurities, which previously was impossible. Simultaneously with the contacts proper, the conductor tracks or metallizations of the device may be manufactured which are deposited on the insulating protecting layer.

Furthermore said materials may readily be used for photoetching. Moreover they may serve as a solvent for the second element of the contact.

Applicants have also found that the elements of the second group of which zinc, beryllium, magnesium and cadmium cause the $p$ conductivity type in a III-V compound and of which tin, sulphur, selenium and tellurium cause the $n$ conductivity type and of which silicon and germanium are amphoteric, can easily be incorporated in the metals of the first group, especially by dissolving, and diffusion at low temperature.

In a preferred embodiment the base metal element is aluminum.

Actually, aluminum as the base element has the advantage of a great flexibility and large initial stability, which properties ensure the continuity of the conductor tracks over the edges of the protective layers.

Furthermore, aluminum which can be welded enables a connection to a housing.

In a second favorable embodiment titanium is used which is afterward covered with a layer of gold. It provides no recrystallizable eutectic and the gold can be connected to the housing. As a second element is preferably used zinc on the $p$ type regions and tellurium on the $n$ type regions.

Actually, zinc has a considerable solubility in the III-V materials. This property is important in itself for it enables a high doping concentration without the formation of alloys at low concentrations; it is also important because it contributes to a high diffusion rate at low temperature, which causes said impurity to be readily incorporated. Furthermore, said material which has a low melting point and a relatively high vapor pressure at low temperature readily evaporates with aluminum, which enables an easy manufacture. On the other hand, said metal is not expensive.

Tellurium has a low melting point and shows good properties for diffusion. It fits in readily with aluminum becuase it forms no alloys with said metal, which would impede the diffusion in the material.

The present invention also relates to a method of obtaining a semiconductor body having contacts, characterized in that on the surface of the said body layers are locally provided, which layers comprise the first and the second element which form contacts and that afterwards heating at a temperature between 350° and 650°C is carried out in a neutral or reducing atmosphere for 10 to 40 minutes.

During said heating, the doping element which is incorporated in the base material penetrates into the surface layer of the body, forms a local diffused layer which just passes through the inversion layer and which minimizes the effect of the potential barrier on said doping level.

In FIG. 1 the distance to the surface of the said body is plotted on the X-axis and the energy levels in electron volts are plotted on the Y-axis.

Curve 1 shows the lowest level of the conduction band and curve 2 shows the highest level of the valency band.

The parts $1a$ and $2a$ of said two curves correspond to the inversion layer.

An incident electron is denoted in said Figure by the arrow F.

In order to penetrate into the body and to reach the conduction band, the electron F must penetrate through the layer with a thickness $a-b$ by tunnel effect. Said thickness is in the order of 0.1 $\mu$m in the case of GaAs, GaP and GaAs P, if the doping level of said material is $10^{17}$ atoms per ccm and of 1 $\mu$m for the GaAs if the doping level is $10^{15}$ atoms per ccm. The number of electrons which can pass through such a thickness by tunnel effect is extremely small.

The supply of the doping element which is incorporated in the contact as a second element and which has diffused to a very small extent by heating, varies a part of the curve as shown at 3.

Under the variations caused by said conversion it may be seen that the thickness of the material which an incident electron has to penetrate by tunnel effect is considerably reduced, for example, in the order of 500 A, which is the thickness of the doped layer which is locally formed by diffusion.

Just because it deals with a diffusion and not with an alloy, the semiconductor body maintains the same properties in all the regions which form same, including in those in which the contacts are formed, as a result of which in particular the formation of said contacts is compatible with the use of photo-etching processes.

By way of example without limitation, a first example will now be described of the formation of contacts on $p$ type material of GaAs in which the base material of the contact is aluminum and the second element is zinc. The deposition is preferably carried out by vacuum evaporation starting from a pseudo alloy of aluminum and zinc with a few per cent (for example 1 to 10% atom per cent.) of zinc. During the process the zinc evaporates first and the aluminum subsequently, which only has advantages. The thickness of the deposited layer is preferably in the order of 1 $\mu$m.

As soon as the material has been deposited, the body is heated in a neutral or reducing atmosphere for 10 to 30 minutes and at a temperature between 400° and 600°C, preferably at 500°C for 15 minutes. Of course, there exists an optimum control for each heating which produces maximum quality.

This method enables the formation of a diffused layer in the order of 500 A depth which is suitable for the manufacture of electroluminescent diodes and for devices with Gunn effect.

The method is identical on $GaAs_xP_{1-x}$ for which $x$ is between 1 and 0.8.

On GaP the only variation is the performance of the heating at a slightly higher temperature, between 550° and 620°C (preferably at 600°C) and for 10 to 20 minutes (preferably 15 minutes).

On the same materials the formation of aluminum-beryllium contacts is carried out in the same manner starting from an alloy of aluminum-beryllium which contains 0.1 to 2% (atom percent) of beryllium.

On $n$ type material and aluminum-tellurium contact is obtained by heating at 600°C for 20 to 40 minutes.

FIG. 2 is a schematic view of a device according to the invention comprising a wafer 1 of a III-V semiconductor having a region 2 of high resistance containing a net number of impurities as aforedescribed of less than $10^{17}$ atoms/ccm, on which an ohmic contact 3 is provided in accordance with the invention.

What is claimed is:

1. A semiconductor device comprising a body of a semiconductor material which consists mainly of at least one element of the column IIIA of the periodic table of elements of which the atomic number is lower than 50 and at least one element of the column VA of the said table of which the atomic number is lower than 52, the said body comprising at least one region of a given conductivity type of which the net number of impurities causing the said given conductivity type is lower than $10^{17}$ atoms per ccm, and at least one ohmic contact to the surface of said one region, said ohmic contact comprising a layer consisting essentially of at least two elements of which the first element is a base metal selected from a first group which consists of: aluminum, tantalum, titanium, and zirconium, and the second element is selected from a second group which consists of zinc, beryllium, magnesium, cadmium, silicon, germanium, tin, sulphur, selenium and tellurium and which causes in the semiconductor region the said given conductivity type, said second element being also incorporated in the region adjacent the surface.

2. A device as claimed in claim 1, wherein the base metal element is aluminum and the second element is zinc.

3. A device as claimed in claim 1, wherein the base metal element is aluminum and the second element is beryllium.

4. A device as claimed in claim 1, wherein the base metal element is titanium which is covered with a layer of gold.

5. A device as claimed in claim 1, wherein the base metal element is aluminum and the second element is tellurium.

6. A device as claimed in claim 1, wherein the second element is present in a relatively small amount compared to the first element.

* * * * *